United States Patent
Den

(10) Patent No.: US 6,611,034 B2
(45) Date of Patent: Aug. 26, 2003

(54) MAGNETIC DEVICE AND SOLID-STATE MAGNETIC MEMORY

(75) Inventor: Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/947,378

(22) Filed: Sep. 7, 2001

(65) Prior Publication Data

US 2002/0058148 A1 May 16, 2002

(30) Foreign Application Priority Data

Sep. 8, 2000 (JP) ........................................ 2000/273952

(51) Int. Cl.⁷ ............................................... H01L 43/00
(52) U.S. Cl. ....................................... 257/421; 257/422
(58) Field of Search ................................ 257/421–425, 257/427, 734, 798, 531, 25; 360/324.2, 123; 438/48, 309

(56) References Cited

U.S. PATENT DOCUMENTS

| | | | |
|---|---|---|---|
| 5,155,093 A | 10/1992 | Den et al. ........................ 505/1 |
| 5,747,859 A | * 5/1998 | Mizushima et al. ......... 257/421 |
| 5,764,567 A | 6/1998 | Parkin .......................... 365/173 |
| 5,973,334 A | * 10/1999 | Mizushima et al. ........... 257/25 |
| 6,139,713 A | 10/2000 | Masuda et al. .............. 205/206 |
| 6,166,948 A | * 12/2000 | Parkin et al. ................ 365/158 |
| 6,278,231 B1 | 8/2001 | Iwasaki et al. .............. 313/310 |
| 6,297,062 B1 | * 10/2001 | Gombinski ............... 435/173.1 |
| 6,326,637 B1 | * 12/2001 | Parkin et al. ................ 257/295 |

FOREIGN PATENT DOCUMENTS

| | | |
|---|---|---|
| JP | 10-283618 | 10/1998 |
| JP | 11-224422 | 8/1999 |

OTHER PUBLICATIONS

Furneaux, et al., "The Formation of Controlled–Porosity Membranes from Anodically Oxidized Aluminum", Letters to Nature, Nature vol. 337, Jan. 12, 1989, pp. 147–149.

Masuda, et al., Kotaibutsuri (Solid State Physics), vol. 31, No. 5, 1996, pp. 57–63.

Masuda, et al., "Fabrication of Gold Nanodot Array Using Anodic Porous Alumina as an Evaporation Mask", Japanese Journal of Applied Physics, vol. 35, 1996, pp. L126–L129.

Dubois, et al., "Perpendicular Giant Magnetoresistance of NiFe/Cu Multilayered Nanowires", Applied Physics Letters, American Institute of Physics, vol. 70, No. 3, Jan. 20, 1997, pp. 396–398.

Katine, et al., "Current–Induced Realignment of Magnetic Domains in Nanostructured Cu/Co Mulitlayer Pillars", Applied Physics Letters, American Institute of Physics, vol. 76, No. 3, Jan. 17, 2000, pp. 354–356.

* cited by examiner

Primary Examiner—David Nelms
Assistant Examiner—Long Tran
(74) Attorney, Agent, or Firm—Fitzpatrick, Cella, Harper & Scinto

(57) ABSTRACT

A magnetic device which has a layer having pores on a substrate and is to be used by applying electric current in the direction of depth of the pores includes a laminated structure in which a first ferromagnetic layer, a second ferromagnetic layer having a smaller coercive force than the first ferromagnetic layer and a non-magnetic layer are laminated within a part or all of the pores, wherein a hard layer having the first ferromagnetic layer, and a free ferromagnetic layer including the second ferromagnetic layer are laminated through the non-magnetic layer, and the hard layer further has a laminated structure in which a plurality of first ferromagnetic layers form antiferromagnetic coupling through the non-magnetic layer. A solid-state magnetic memory has the magnetic device.

22 Claims, 6 Drawing Sheets ial lattices by Fert et al. and Grunberg et al. in 1986 to 1988, and this has been called "Giant Magneto-Resistance, GMR". This GMR has a special feature that it has a negative rate of change of resistance with respect to an applied magnetic field and has a great (a few tens percent) change in resistivity. The cause of GMR is qualitatively explained as follows. First, when there is no magnetic field, magnetic layers of the artificial lattice are arranged in an antiferromagnetic way (interlayer antiferromagnetism). When a magnetic field is applied in this case, magnetization of each layer is arranged in parallel. At this time, conduction arranged electrons are strongly scattered in a magnetizing non-parallel state, and the electric resistance decreases by the magnetic field by means of a mechanism having a dependence on such a spin as weakly scattered in a magnetizing parallel state. Theoretically, non-parallelism of interlayer magnetization has been studied by the use of a RKKY type long-distance exchange interaction or a quantum well model, and interlayer spin-dependent scattering has been discussed by a theory based on a binary fluid model of conduction electrons.

MAGNETIC DEVICE AND SOLID-STATE MAGNETIC MEMORY

BACKGROUND OF INVENTION

1. Field of the Invention

A magnetic device according to the present invention can be utilized over a wide range such as a magnetic memory, a magnetic sensor and a spin operational device. Particularly, the present invention is useful as a part of a solid-state magnetic memory device.

2. Related Background Art

Conventionally, for a solid-state memory device, DRAM, SRAM, flash memory, EEPROM and FeRAM have been used. In recent years, however, from the viewpoints of non-volatility, higher speed and higher density, a magnetic solid memory, particularly a memory using a TMR or GMR effect has attracted much interest and its study has advanced. In the following description, a solid-state magnetic memory closely related to the present invention will be described.

First, a giant magneto-resistance (GMR) will be simply described. As regards the GMR, a magnetio-resistive change larger than an AMR (Anisotropic Magnetic Resistance) was discovered with ferromagnetic (Fe)/non-magnetic (Cr) (Chromium) artificial lattices by Fert et al. and Grunberg et al. in 1986 to 1988, and this has been called "Giant Magneto-Resistance, GMR". This GMR has a special feature that it has a negative rate of change of resistance with respect to an applied magnetic field and has a great (a few tens percent) change in resistivity. The cause of GMR is qualitatively explained as follows. First, when there is no magnetic field, magnetic layers of the artificial lattice are arranged in an antiferromagnetic way (interlayer antiferromagnetism). When a magnetic field is applied in this case, magnetization of each layer is arranged in parallel. At this time, conduction arranged electrons are strongly scattered in a magnetizing non-parallel state, and the electric resistance decreases by the magnetic field by means of a mechanism having a dependence on such a spin as weakly scattered in a magnetizing parallel state. Theoretically, non-parallelism of interlayer magnetization has been studied by the use of a RKKY type long-distance exchange interaction or a quantum well model, and interlayer spin-dependent scattering has been discussed by a theory based on a binary fluid model of conduction electrons.

In order to utilize this GMR effect as a device such as a memory, the orientation of magnetization of a partial ferromagnetic layer is fixed while the orientation of magnetization of the other ferromagnetic layer is changed to use it as a memory. A device having such a structure is called "spin valve type". Also, a layer (layer having a high coercive force), the orientation of magnetization of which remains unchanged, is called "hard layer (pin layer)" while a layer (layer having a low coercive force), the orientation of magnetization of which is changed, is called "free layer". Contrary to this, there has also been adopted a method of reading a state of magnetization (memory state) from the change in resistance by recording on the hard layer and reversing the free layer.

Concerning this GMR, there have been known CIP (Current in Plane) type, CPP (Current Perpendicular to Plane) type, CPA (Current at an Angle) type, which is a type of their mixture, granular alloy type or the like. Generally, the CIP structure has most been studied in terms of its ease of fabrication. However, the CIP type, in which electric current flows in parallel with a lamination interface, has a change in resistivity being 40 to about 50% because of contribution of conduction electrons which do not interface spin scattering, or the like. In contrast, the CPP type, in which electric current flows in a direction perpendicular to the lamination interface, may have a change in resistivity exceeding 100% because of all electrons being exposed spin scattering having a dependence on the spin state on the lamination interface, an effect of increased Fermi velocity based on an energy gap resulting from the laminated structure, or the like, and the CPP type has better basic characteristics.

However, since the CPP type flows electric current in a direction perpendicular to the film surface, its resistance itself tends to become a very small value. For this reason, a pore enveloping the laminated structure must be made into a shape having a very small cross-sectional area.

In the CPP type GMR device into a pore, as an example of a structure which is not a simple laminated structure having a ferromagnetic layer/non-magnetic layer, there is one specified in Applied Physics Letters Vol. 70, 396 (1997). In this paper, there is specified an example in which lamination is performed with three-layer structure of NiFe alloy/Cu/NiFe alloy interposed between thick Cu layers, and this operation provides an effect in which the saturation magnetic field decreases. In this example of configuration, however, any sufficient memory effect has not yet appeared.

Also, as an example showing the memory effect, there is one specified in Applied Physics Letters Vol. 76, 354 (2000). In this paper, it is specified that the configuration is arranged such that a ferromagnetic layer (free ferromagnetic layer 14) having a thin layer is interposed between a ferromagnetic layer (hard layer 61) having such a thick layer as shown in FIG. 6A and a non-magnetic layer 62 for lamination, whereby a memory effect having a change in resistance being about 10% is exhibited. However, the reversal of this memory state is not clear.

<Tunnel Type Magnetic Memory>

As a memory cell using a tunnel junction, such a spin valve type as disclosed in U.S. Pat. No. 5,764,567 specification has generally been used. Such a cell has a laminated structure of a pin layer, an insulating layer, a ferromagnetic layer or the like. The orientation of magnetization in the ferromagnetic layer is directed toward one of the longitudinal axes of an ordinary cell. Particularly when the orientations of two ferromagnetic layers with an insulating layer interposed therebetween are same, the tunneling current is increased, and the cell resistance value decreases. On the contrary, when the orientations of two ferromagnetic layers with an insulating layer interposed therebetween are opposite, the tunneling current decreases, and the cell resistance value is increased. As shown in FIG. 6B, as regards the orientation of magnetization of this ferromagnetic material layer, of two magnetic material layers normally, one magnetic material layer (pin layer 61) is left fixed with an antiferromagnetic layer 63, and the orientation of magnetization of the other magnetic material layer (free ferromagnetic layer 14) is changed. In the figure, the non-magnetic layer 62 is the insulating layer. The orientation of magnetization of this free ferromagnetic layer 14 is controlled and held by a magnetic field generated by electric current flowing through up and down wiring of the element. Generally, by means of a vector sum of the magnetic field to be generated by the up and down wiring orthogonally intersecting, only a selected cell portion is written. Reading-out is performed through a reading-out line or the like wired on the cell. The cell is selected by MOSFET or the like.

The rate of change of resistance of the TMR type can be made infinitely high in calculation, but values which can actually be fabricated are about 40 to about 60%. Also, it is how to fabricate the insulating layer and dependency of the rate of change of resistance on bias that most matter in fabrication and characteristics. More specifically, it is necessary to uniformly fabricate insulating layers having thickness of about 1 nm, but it is difficult to fabricate. Also, when the voltage is made higher, there arises a problem of dependency on bias that the rate of change of resistance will greatly decrease. These problems did not exist with the GMR device.

Since the present invention uses the GMR structure of CPP type, a pore having a large aspect ratio becomes necessary. As a method of obtaining this structure, a membrane filter using track etching and anodized alumina are known. Hereinafter, the detailed description will be made of the most preferable anodized alumina.

<The Anodized Alumina>

When an Al plate is anodized in acid electrolyte such as sulphuric acid, oxalic acid, and phosphoric acid, an anodized alumina layer, which is a porous anodization film, is formed (See, for example, R. C. Furneaux, W. R. Rigby & A. P. Davidson NATURE Vol. 337P147 (1989) or the like.). The special feature of this porous film is to have a peculiar geometric structure in which exceedingly minute cylindrical column-shaped pores (nanoholes) having a diameter of several nm to several hundred nm are arranged at intervals of several tens nm to several hundred nm in parallel. Each of these cylindrical column-shaped pores has a high aspect ratio, and is also excellent in uniformity of diameter of the cross section.

Also, the structure of the porous film can be controlled to a certain extent by changing the condition for anodizing. For example, it has been known that the pore interval can be controlled by anodizing voltage, the pore depth can be controlled by anodizing time, and the pore diameter can be controlled to a certain extent by a pore wide treatment. The pore wide treatment here is etching of alumina, and normally, a wet etching treatment in phosphoric acid is used.

Also, in order to improve perpendicularity, linearity and independence of the pore of porous film, there has been proposed a method of anodizing in two stages, that is, a method of producing porous film having pores showing better perpendicularity, linearity and independence by removing porous film formed by anodizing once, and thereafter anodizing again (Japanese Journal of Applied Physics, Vol. 35, Part 2, No. 1B, pp. L126–L129, Jan. 15, 1996. This method takes advantage of the fact that a recess on the surface of an Al plate, which is produced when the anodized film formed by the first anodizing is removed, becomes a formation starting point of the pore by the second anodizing.

Further, in order to improve controllability of the shape, interval and pattern of pores of porous film, there has also been proposed a method of forming a formation starting point for the pores using a stamper, that is, a method of fabricating porous film having pores showing better controllability of shape, interval and pattern by forming a recess obtained by pressing a substrate having a plurality of projections on the surface thereof against the surface of an Al plate, as a formation starting point for pores, and thereafter, anodizing (U.S. Pat. No. 6,139,713 specification or Masuda's Solid State Physics 31,493 (1996) or the like). Also, there has also been reported a technique for forming pores concentrically instead of honeycomb (Japanese Patent Application Laid-Open No. 11-224422 or the like).

Also, in Japanese Patent Application Laid-Open No. 10-283618 specification, there has been disclosed a technique for embedding laminated magnetic film having GMR characteristics into such an anodized alumina nanohole as described above. This specification discloses a technique for forming a hard ferromagnetic layer and a free ferromagnetic layer by taking advantage of a difference in composition, but its rate of change of resistance is about 10% and the memory effect is also insufficient.

SUMMARY OF THE INVENTION

The general GMR magnetic device previously described has a rate of change of resistance being about 40% because it is of the CIP type, and is insufficient. Also, in the GMR device of the CPP type, the stability and uniformity of the hard layer were insufficient.

An object of the present invention is to solve these problems of the prior art, and is to provide a magnetic device easy to fabricate, with higher density, having a laminated structure excellent in stability of a hard layer within a cell having a large aspect ratio even in the CPP type GMR device, which generates an initial state of magnetization of the hard layer and the free layer more easily and with stability, and a solid-state magnetic memory with the magnetic device.

The above-described object according to the present invention can be attained by a magnetic device, having a pore layer, on the substrate of which pores have been formed, in which in a part or all of the interior of the pores, a ferromagnetic layer and a non-magnetic layer are laminated, and which is used by applying electric current in the axial direction of the pores, wherein in the laminated structure within the pores, the plurality of ferromagnetic layers comprise a hard layer, which is a laminated structure portion having antiferromagnetic coupling through the non-magnetic layer, and a free ferromagnetic layer laminated through a non-magnetic layer; and a solid-state magnetic memory having the magnetic device.

According to an aspect of the present invention, there is provided a magnetic device which has a layer having pores on a substrate and is to be used by applying electric current in the direction of depth of the pores, comprising: a laminated structure in which ferromagnetic layers and non-magnetic layers are laminated within a part or all of the pores, wherein a hard layer and a free ferromagnetic layer are laminated through the non-magnetic layer, and the hard layer further has a laminated structure in which a plurality of ferromagnetic layers form antiferromagnetic coupling through the non-magnetic layers.

According to another aspect of the present invention, there is provided a solid-state magnetic memory having the magnetic device.

BRIEF DESCRIPTION OF THE DRAWINGS

FIG. 1A is a perspective view showing a magnetic device, and FIG. 1B is a schematic partial cross-sectional view showing an example of lamination of a laminated magnetic material of the magnetic device;

FIG. 4A shows rectangular array, and FIG. 4B shows honeycomb array;

DETAILED DESCRIPTION OF THE INVENTION

Figure 1A:
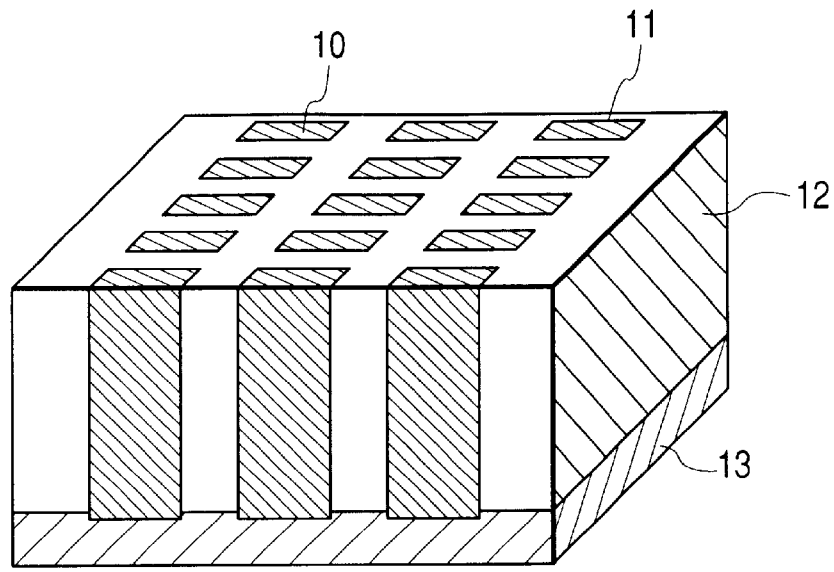
FIGS. 1A and 1B are views showing an embodiment according to the present invention.

In the figures, like reference characters indicate like parts or meanings.

Figure 1B:
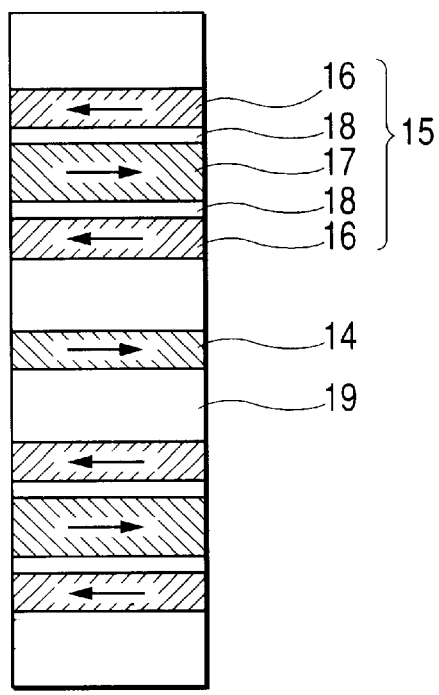

With reference to FIGS. 1A and 1B, the description will be made of an operation of the present invention. FIG. 1A is a perspective view showing a magnetic device when a three-layer ferromagnetic layer is used for the hard layer, and FIG. 1B is its partial cross-sectional view. In FIGS. 1A and 1B, reference numeral 10 denotes a laminated magnetic material; 11, a fine pore; 12, a fine pore layer; 13, a ground layer; 14, a free ferromagnetic layer; 15, a hard layer; 16, a thin ferromagnetic layer within the hard layer; 17, a thick ferromagnetic layer within the hard layer; 18, a thin non-magnetic layer within the hard layer; and 19, a thick non-magnetic layer for realizing the free layer. FIG. 1 shows an example in which a hard layer consisting of three ferromagnetic layers is used, and wiring in the upper part or the like are omitted.

First, in order to determine an initial state of magnetization, when a sufficiently large magnetic field is applied to the right in FIG. 1B, the magnetization of all the ferromagnetic layers is turned toward the applied magnetic field (State A). Next, when the applied magnetic field is set to zero or a magnetic field somewhat opposite in direction is applied, a thin ferromagnetic layer 16 having a small coercive force within the hard magnetic layer 15 is reversed, and settles into a antiferromagnetic magnetized state with a thick ferromagnetic layer 17 having a great coercive force (State B). This is because since the interaction between each ferromagnetic layer within the hard layer 15 is large, to change into a magnetized state alternately opposite in direction ensures more stability in terms of energy than to direct all the ferromagnetic layers within the hard layer 15 toward the same direction. This reversal is liable to occur with the ferromagnetic layer 16 having a thin layer (small coercive force), and the orientation of the ferromagnetic layer 17 having a thick layer (large coercive force) does not change. Also, the free magnetic layer 14 maintains the initial magnetized state because the interaction with the ferromagnetic layer 16 adjacent thereto with a non-magnetic layer 19 interposed therebetween is weak. As a result, it enters the state shown in FIG. 1B. In this state, it is a high resistance state as the GMR because each ferromagnetic layer is turned toward the alternately opposite direction.

Next, when the magnetic field is applied to the left in the same drawing, first the free magnetic layer 14, which is a ferromagnetic layer, is reversed toward the applied magnetic field (State C). In this state, it enters a low-resistance state because the ferromagnetic layer 16 within the hard layer 15, which is adjacent to the free magnetic layer 14 with the non-magnetic layer 19 interposed therebetween and the free magnetic layer 14 have the same direction of magnetization. Further, when the applied magnetic field is made greater to the left, it enters a further low-resistance state because all the ferromagnetic layers are magnetized to the left (State D). When no magnetic field is applied, the orientation of magnetization of the thin ferromagnetic layer 16 within the hard layer 15 is reversed (State E).

In such a process of applied magnetization, for example, State B and State C are caused to correspond to 0 and 1 of the memory respectively and the magnetization of the free magnetic layer 14 is switched in an adequate applied magnetic field, whereby a memory operation is to be started. Also, for example, the State B, C and the State E are caused to correspond to 0 and 1 of memory and the magnetization is switched in a comparatively great applied magnetic field, whereby a memory operation involving magnetized reversal within the hard layer 15 is to be started. In the latter example, only the free ferromagnetic layer 14 is reversed to read a change in resistance, whereby the state of the ferromagnetic layer within the hard layer 15 can be read, and therefore, this is useful as a memory device having a high S/N ratio.

For material for the ferromagnetic layer according to the present invention, any ferromagnetic material having conductive property can be used, and material having high spin polarizability and material, the constitution of which can be easily controlled, are preferable. As such material, there are, for example, simple substances of Co, Fe and Ni of iron family and their alloy, or alloy and oxide which are mainly composed of these elements. The thickness of each ferromagnetic layer is available between several hundred pm and several tens nm, but layer thickness of 1 nm to 5 nm is preferable in consideration of the characteristics of rate of change of resistance.

For material for the non-magnetic layer, any non-magnetic metals having conductive property can be used, but for example, simple substances of metal such as Cu, Ag, Cr and Au, or alloys mainly composed of these metals are preferable. The thickness of each non-magnetic layer is available between several hundred pm and several tens nm, but layer thickness of 1 nm to 10 nm is preferable in consideration of the characteristics of rate of change of resistance.

As regards the lamination of these ferromagnetic layer and non-magnetic layer, there can be a hard layer, which is a portion of a laminated structure having antiferromagnetic coupling, and a free ferromagnetic layer in the laminated structure as shown in FIG. 1B. The free ferromagnetic layer is preferably a thin ferromagnetic layer interposed between non-magnetic layers, each having a comparatively thick layer, and for their layer thickness, the thick non-magnetic layer has preferably thickness of several nm to several tens nm, and the free ferromagnetic layer has thickness of several hundred pm to several nm.

The hard layer can basically have configuration in which there are two or more ferromagnetic layers between which a thin non-magnetic layer is interposed. This hard layer is preferably interposed between thick non-magnetic layers in order to weaken the magnetic coupling with the free ferromagnetic layer. The thickness of the non-magnetic layer in the hard layer is preferably within a range of several hundred pm to several nm, and the thickness of the ferromagnetic layer in the hard layer is preferably within a range of several hundred pm to several tens nm.

Figure 2A:
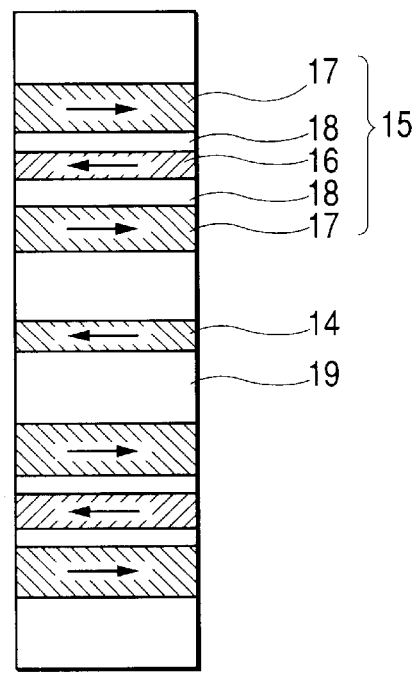
FIGS. 2A and 2B are schematic partial cross-sectional views showing an example of lamination of a laminated magnetic material in the magnetic device according to the present invention respectively.
Figure 2B:
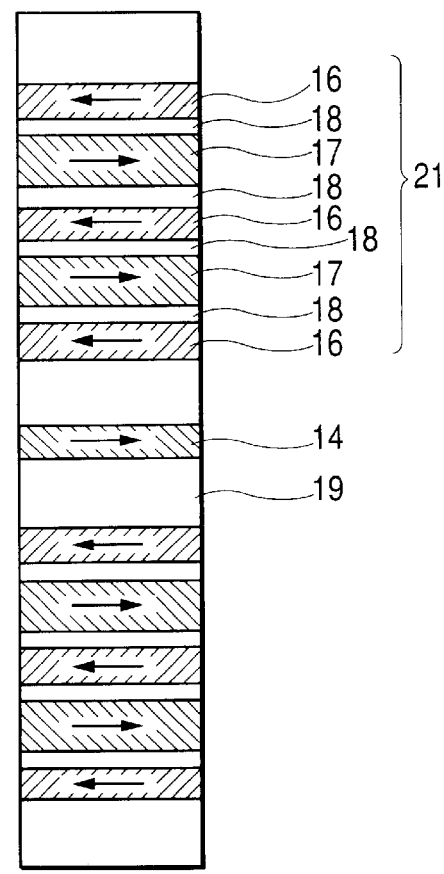

The ferromagnetic layer in the hard layer is preferably constructed such that a ferromagnetic layer having a large coercive force and a ferromagnetic layer having a small coercive force are combined. As shown in, for example, FIG. 1B, to combine a thick ferromagnetic layer with a thin ferromagnetic layer is preferable in order to produce an antiferromagnetic coupled state. That is, in order to shift from a state in which a strong magnetic field has been applied to the magnetized state shown in FIG. 1B with stability, it is effective to reverse the magnetization of the thin ferromagnetic layer in a state in which the thick ferromagnetic layer has been fixed. In order to form this state, in addition to such laminated structure of "thin ferromagnetic layer/thin non-magnetic layer/thick ferromagnetic layer/thin non-magnetic layer/thin ferromagnetic layer" as shown in FIG. 1B, such laminated structure of "thick ferromagnetic layer/thin non-magnetic layer/thin ferromagnetic layer/thin non-magnetic layer/thick ferromagnetic layer" as shown in FIG. 2A is also effective. Also, the configuration in which a hard layer 21 has been formed through the use of such a five-layer ferromagnetic layer obtained by continuing this state as shown in FIG. 2B, also provides more stability as a hard layer. In such configuration as shown in FIG. 2B, however, since a ratio of the layer contributing to the rate of change in resistance decreases, a number of the ferromagnetic layers in the hard layer is preferably three as shown in FIG. 1B and FIG. 2A.

Figure 3A:
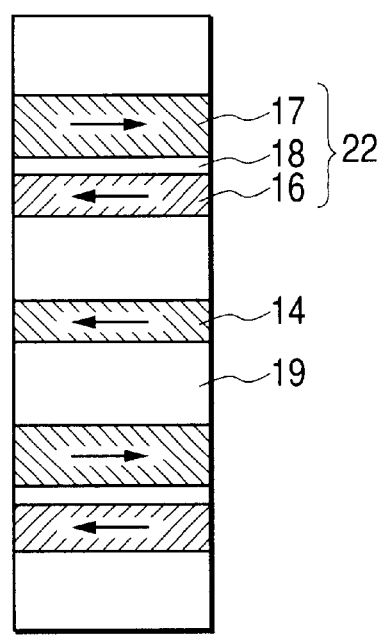
FIGS. 3A and 3B are schematic partial cross-sectional views showing an example of lamination of a laminated magnetic material in the magnetic device according to the present invention respectively.
Figure 3B:
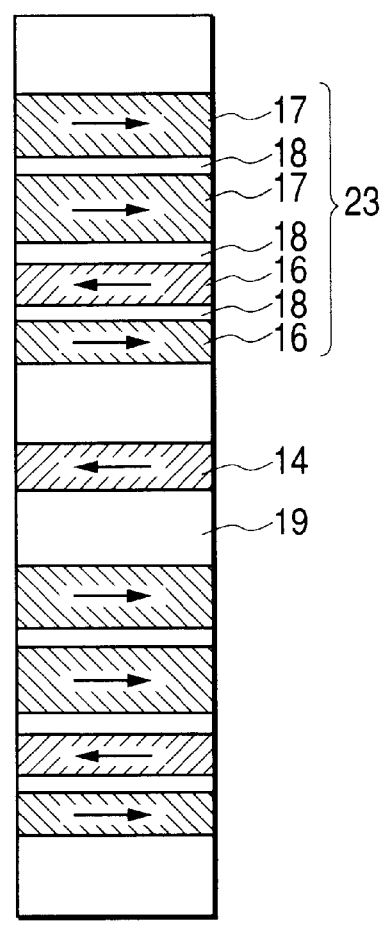

Further, an example, in which the number of the ferromagnetic layers in the hard layer is two or four, is shown in FIG. 3A or 3B. Numerals 22 and 24 denote hard layers comprised of two and four ferromagnetic layers, respectively. In such a state as shown in FIG. 3A, however, a change in resistance may not sufficiently appear even if the magnetization of the free ferromagnetic layer is reversed. Also, in a state in which the thick ferromagnetic layers are adjacent each other with the non-magnetic layer interposed therebetween in such a hard layer as shown in FIG. 3B, the hard layer itself tends to become unstable with respect to the magnetic field. From these facts, the number of the ferromagnetic layers in the hard layer is preferably an odd number of three or higher, and further, the configuration having three ferromagnetic layers, in which the thick ferromagnetic layer is interposed between the thin ferromagnetic layers through the non-magnetic layer as shown in FIG. 1B, or in which the thin ferromagnetic layer is interposed between the thick ferromagnetic layers as shown in FIG. 2A is most effective.

A magnetic device according to the present invention has the configuration, in which a magnetic material laminated in the pores as described above has been embedded, and the examples of lamination shown in FIG. 1B, FIGS. 2A and 2B and FIGS. 3A and 3B show only 1.5 unit portion of the laminated structure. More specifically, actually, one portion in the pore or a plurality of units are repeatedly laminated from below over above. Accordingly, an actual period of lamination is determined depending upon length of the pore and length of the unit. In the present invention, the configuration is preferably arranged by connecting the units of five periods to several hundred periods.

In the magnetic device according to the present invention, the existence of the above-described laminated structure in the pore is required in order to sufficiently detect a signal. The diameter of the pore is preferable within a range of several nm to several hundred nm, and the aspect ratio of the pore is preferably 5 or higher. The cross-sectional shape of the pore can be made into a circle, an ellipse, a rectangle or the like, and the cross-section of each pore is preferably uniform. When the cross-sectional shape of the pore is a rectangle, the orientation of magnetization in the ferromagnetic film is preferably turned toward the major axis, and in the case of the circle, it is also possible to utilize rotation magnetization.

In order to form the pore, a general semiconductor lithography method, an EB (electron beam) lithography method or the like can be utilized, and as a method of forming a pore having a large aspect ratio with good controllability, an anodizing method of aluminum is very effective. In the anodizing method of aluminum, the pore diameter can be controlled within a range of about 10 to several hundred nm, and the pore interval can also be controlled within a range of a value somewhat larger than the pore diameter to about 500 nm. For anodizing aluminum, various acid can be utilized, but in order to form pores with minute intervals, a sulphuric acid bath is preferable, in order to form pores with comparatively large intervals, a phosphoric acid bath is preferable, and in order to form pores with intermediate intervals, an oxalic acid bath is preferable. The pore diameter can be enlarged by a method of etching in solution of phosphoric acid or the like after anodizing.

Figure 4A:
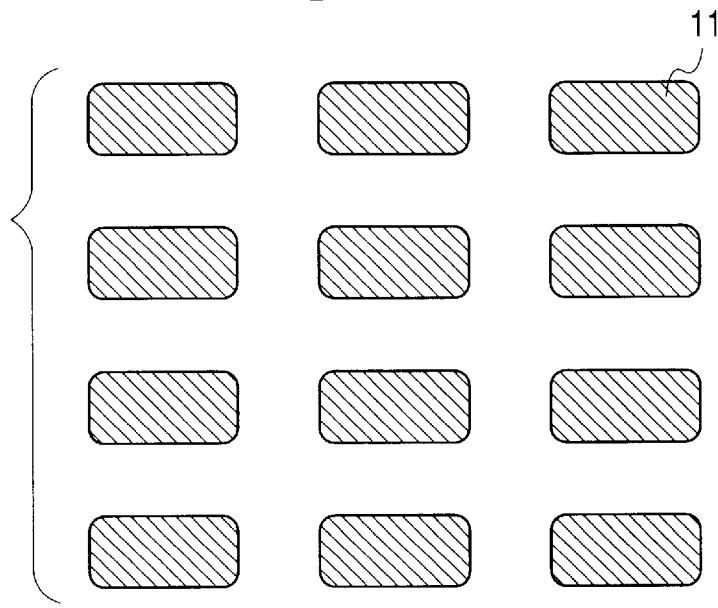
FIGS. 4A and 4B are schematic views showing an example of arrangement of pores in the magnetic device according to the present invention.
Figure 4B:
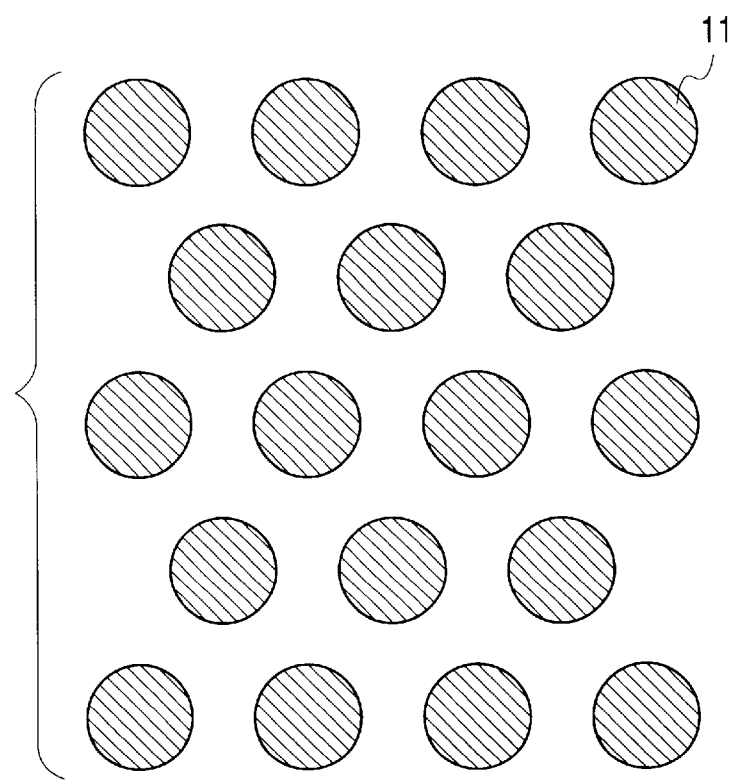

In order to systematically form the pores, the method of forming a recess, which serves as a starting point for formation of the pore as described above, on the surface of aluminum in advance or the two-stage anodizing method is effective. As pore arrangement to be used in the present invention, such rectangular array or honeycomb array as shown in FIGS. 4A and 4B, square array, which is their special case, or the like are preferable. However, in the case where wiring is carried out for each of the pores for utilizing, such systematic arrangement is required, but when wiring is collectively carried out for a plurality of the pores for utilizing, the arrangement may be made at random.

For ground metal for an anodized alumina nanohole, various metals are available, and when laminated film is produced in, for example, a pore by the electrodeposition process, the ground metal is preferably Cu in terms of electrodeposition controllability.

For the non-anodized layer, Al is generally used, and film mainly composed of Al, capable of being anodized may be used even if other elements are contained. In order to form this Al film, for example, the vacuum deposition method of using resistance heating, the sputtering method, the CVD method or the like can be utilized. However, any other than a method capable of forming film having a surface which is flat to a certain extent is not preferable.

In order to laminate and embed a ferromagnetic material and a non-magnetic material into a pore, the vacuum deposition method, the sputtering method or the like can be utilized, and in order to embed into a pore having a large aspect ratio, the electrodeposition process is preferable. In order to form laminated film by the electrodeposition process, a method of pulse electrodepositing in solution containing ions having different electrolytic potentials is effective. For material advantageous to the electrodeposition process, laminated film of Cu and Co, laminated film of Cu and NiFe alloy or the like are preferable.

In a magnetic device according to the present invention, it is a very useful use to utilize it particularly as a part of a solid state magnetic memory. In addition, however, it can be utilized for a signal detection unit or the like in a magnetic switching device and a magnetic calculation device including a magnetic sensor. When the magnetic device according to the present invention is utilized as a magnetic sensor, it is necessary to carry out at least two wiring in the bottom part and the upper part of the pore. Also, when used as a memory, writing wire or the like are also required in addition to these reading wires.

EXAMPLES

Hereinafter, with reference to the examples, the further detailed description will be made of the present invention.

Examples 1 to 6, and Comparative Example 1

In the present examples, through the use of a pore layer of the anodized alumina nanohole, various laminated electro-deposition was performed within the pore. FIGS. 5A to 5E are schematic cross-sectional views showing a process of the present examples, and in theses drawings, reference numeral 51 denotes a substrate; 13, a ground layer; 52, Al film; 53, an alumina nanohole; 54, an anodized alumina layer; 10, a laminated magnetic material; 55, a surface insulating layer; and 56, an upper electrode.

Figure 5A:
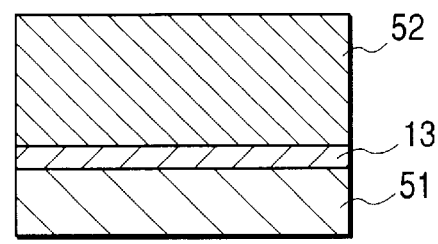
FIGS. 5A, 5B, 5C, 5D and 5E are fabrication process views showing the magnetic device according to the embodiment.
Figure 5B:
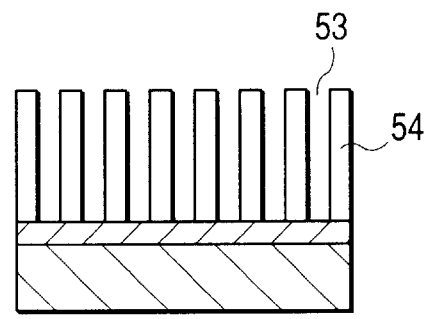

First, on the Si substrate 51, Ti and Cu films 5 nm and 10 nm in thickness were formed by the sputtering method as the ground layer 13, and on top thereof, Al film 52 of 1 μm thickness was formed by the sputtering method to bring about the state shown in FIG. 5A. After the substrate is installed in a holder so as to prevent any other than the Al surface portion from touching the solution, anodization was performed on the Al surface in a 0.3 mol/liter (0.3 M) oxalic acid aqueous solution held at temperature of 16° C. at constant voltage of 40 V. When this Al anodization is completed and the anodization current decreases, the anodization was completed and thereafter, a pore wide (opening) treatment was performed in a 5% by mass phosphoric acid aqueous solution for 30 minutes. Because of this treatment, the Al film 52 has, as shown in FIG. 5B, become an anodized alumina nanohole film having a pore (alumina nanohole 53) with a diameter of about 50 nm, and the pore bottom portion has a somewhat-enlarged portion and penetrated to the Cu ground film 13.

Next, a substrate with this anodized alumina nanohole film formed was dipped in an electroplating solution consisting of cobalt sulfate 0.5 M and copper sulfate 0.001 M together with an counter electrode of platinum to electrodeposit a laminated magnetic material until the upper part of the pore is filled with an electroplating substance under an Ag—AgCl reference electrode with the following condition as a period (a layer formed in the period concerned is shown).

Example 1
"Electrodeposition Condition"
-1.2 V (0.3 second)/-0.56 V (14 seconds)/-1.2 V (0.1 second)/-0.56 V (30 seconds)/-1.2 V (0.1 second)/-0.56 V (30 seconds)

"Layer Configuration"
Thick Co base ferromagnetic layer 17 (about 2.5 nm)/thin Cu non-magnetic layer 18 (about 1.2 nm)/thin Co base ferromagnetic layer 16 (about 1 nm)/thick Cu non-magnetic layer 19 (about 3 nm)/Co base free ferromagnetic layer 14 (about 1 nm)/thick Cu non-magnetic layer 19 (about 3 nm).

Example 2
"Electrodeposition Condition"
-1.2 V (0.3 second)/-0.56 V (14 seconds)/-1.2 V (0.1 second)/-0.56 V (14 seconds)/-1.2 V (0.3 second)/-0.56 V (30 seconds)/-1.2 V (0.1 second)/-0.56 V (30 seconds)

"Layer Configuration"
Thick Co base ferromagnetic layer 17 (about 2.5 nm)/thin Cu non-magnetic layer 18 (about 1.2 nm)/thin Co base ferromagnetic layer 16 (about 1 nm)/thin Cu non-magnetic layer 18 (about 1.2 nm)/thick Co base ferromagnetic layer 17 (about 2.5 nm)/thick Cu non-magnetic layer 19 (about 3 nm)/Co base free ferromagnetic layer 14 (about 1 nm)/thick Cu non-magnetic layer 19 (about 3 nm).

Example 3
"Electrodeposition Condition"
-1.2 V (0.1 second)/-0.56 V (14 seconds)/-1.2 V (0.3 second)/-0.56 V (14 seconds)/-1.2 V (0.1 second)/-0.56 V (30 seconds)/-1.2 V (0.1 second)/-0.56 V (30 seconds)

"Layer Configuration"
Thin Co base ferromagnetic layer 16 (about 1 nm)/thin Cu non-magnetic layer 18 (about 1.2 nm)/thick Co base ferromagnetic layer 17 (about 2.5 nm)/thin Cu non-magnetic layer 18 (about 1.2 nm)/thin Co base ferromagnetic layer 16 (about 1 nm)/thick Cu non-magnetic layer 19 (about 3 nm)/Co base free ferromagnetic layer 14 (about 1 nm)/thick Cu non-magnetic layer 19 (about 3 nm).

Example 4
"Electrodeposition Condition"
-1.2 V (0.1 second)/-0.56 V (14 seconds)/-1.2 V (0.3 second)/-0.56 V (14 seconds)/-1.2 V (0.1 second)/-0.56 V (14 seconds)/-1.2 V (0.3 second)/-0.56 V (14 seconds)/-1.2 V (0.1 second)/-0.56 V (30 seconds)/-1.2 V (0.1 second)/-0.56 V (30 seconds)

"Layer Configuration"
Thin Co base ferromagnetic layer 16 (about 1 nm)/thin Cu non-magnetic layer 18 (about 1.2 nm)/thick Co base ferromagnetic layer 17 (about 2.5 nm)/thin Cu non-magnetic layer 18 (about 1.2 nm)/thin Co base ferromagnetic layer 16 (about 1 nm)/thin Cu non-magnetic layer 18 (about 1.2 nm)/thick Co base ferromagnetic layer 17(about 2.5 nm)/thin Cu non-magnetic layer 18 (about 1.2 nm)/thin Co base ferromagnetic layer 16 (about 1 nm)/thick Cu non-magnetic layer 19 (about 3 nm)/Co base free ferromagnetic layer 14 (about 1 nm)/thick Cu non-magnetic layer 19 (about 3 nm).

Example 5
"Electrodeposition Condition"
-1.2 V (0.3 second)/-0.56 V (14 seconds)/-1.2 V (0.3 second)/-0.56 V (14 seconds)/-1.2 V (0.1 second)/-0.56 V (14 seconds)/-1.2 V (0.1 second)/-0.56 V (30 seconds)/-1.2 V (0.1 second)/-0.56 V (30 seconds).

"Layer Configuration"
Thick Co base ferromagnetic layer 17 (about 2.5 nm)/thin Cu non-magnetic layer 18 (about 1.2 nm)/thick Co base ferromagnetic layer 17 (about 2.5 nm)/thin Cu non-magnetic layer 18 (about 1.2 nm)/thin Co base ferromagnetic layer 16 (about 1 nm)/thin Cu non-magnetic layer 18 (about 1.2 nm)/thin Co base ferromagnetic layer 16 (about 1 nm)/thick Cu non-magnetic layer 19 (about 3 nm)/Co base free ferromagnetic layer 14 (about 1 nm)/thick Cu non-magnetic layer 19 (about 3 nm).

Example 6
"Electrodeposition Condition"
-1.2 V (0.15 second)/-0.56 V (14 seconds)/-1.2 V (0.15 second)/-0.56 V (30 seconds)/-1.2 V (0.15 second)/-0.56 V (30 seconds)

"Layer Configuration"
Co base ferromagnetic layer 16 (about 1.5 nm)/thin Cu non-magnetic layer 18 (about 1.2 nm)/Co base ferromagnetic layer 16 (about 1.5 nm)/thick Cu non-magnetic layer 19 (about 3 nm)/Co base free ferromagnetic layer 14 (about 1.5 nm)/thick Cu non-magnetic layer 19 (about 3 nm).

Comparative Example 1
"Electrodeposition Condition"
-0.56 V (14 seconds)/-1.2 V (0.1 second)

"Layer Configuration"
Cu non-magnetic layer (about 1.2 nm)/Co base ferromagnetic layer (about 1 nm)

Figure 5C:
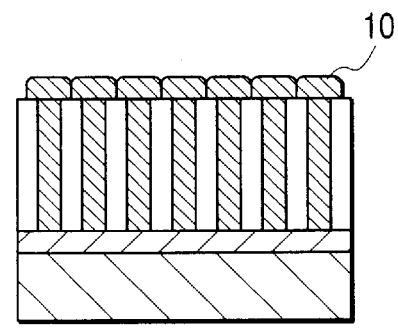

As a result, such a laminated magnetic material 10 as shown in FIG. 5C was formed within the alumina nanohole 53, and in the upper part thereof. In this case, when voltage of −0.56 V is applied, only Cu having low electrolytic voltage is electro-deposited, and when voltage of −1.2 V is applied, Co having high density is mainly electrodeposited, and as a result, a laminated magnetic film comprising a plurality each of non-magnetic layers, each consisting of Cu and ferromagnetic layers, each containing somewhat Cu, mainly composed of Co laminated has been formed.

Figure 5D:
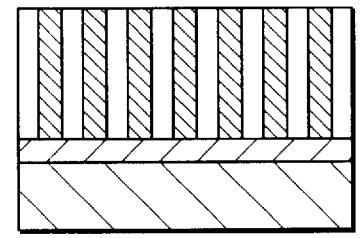
Figure 5E:
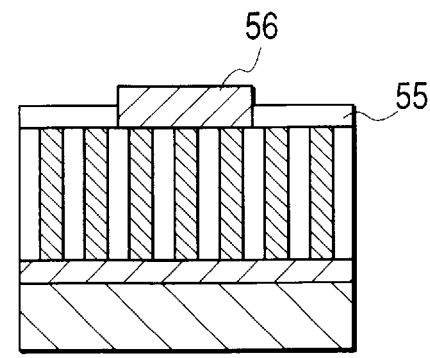
Figure 6A:
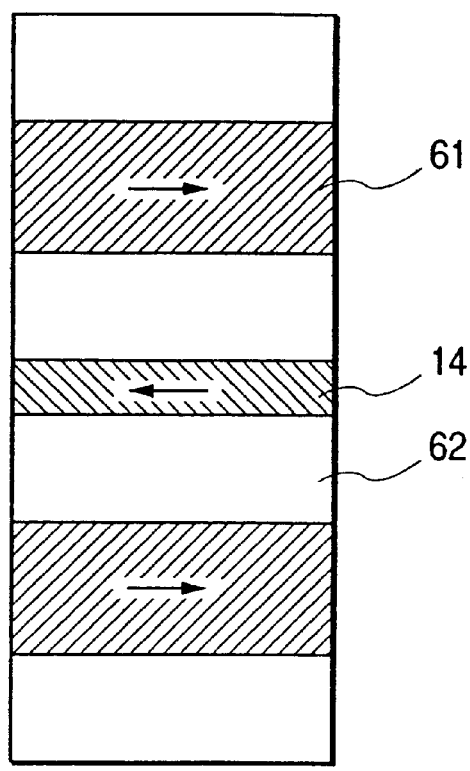
FIGS. 6A and 6B are schematic partial cross-sectional views showing an example of lamination in the laminated magnetic material of a GMR(TMR) type magnetic device according to the prior art respectively.
Figure 6B:
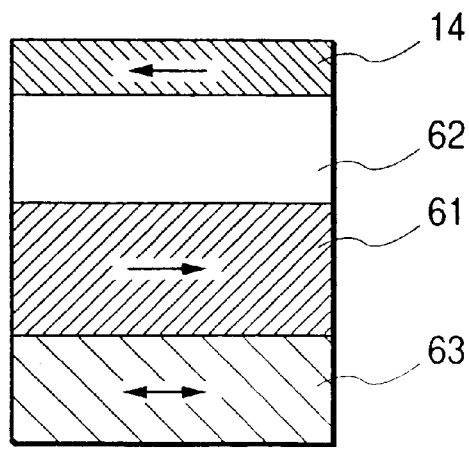

Next, a laminated magnetic film appeared in the upper part of the alumina nanohole 53 was removed by surface polishing to bring about the state shown in FIG. 5D. On the top thereof, a surface insulated layer 55 about 50 nm in thickness was formed using silicon oxide, and a part thereof was removed and on the removal portion, Cu film 50 nm in thickness, which is an upper electrode 56, was formed to obtain the structure shown in FIG. 5E. In each of these laminated magnetic films, an unit of hard layer/thick non-ferromagnetic layer/free ferromagnetic layer was formed within the pore for about 60 to about 140 periods.

The magnetic devices according to Examples 1 to 6 and Comparative Example 1, which has been fabricated as described above, have been evaluated in terms of change in resistance in the magnetic field. This evaluation was performed by the following method, that is, concretely, a state, in which a sufficiently great 8 KOe (Oersted) magnetic field is first applied in the right direction in FIG. 5E, and thereafter, has been returned to 0 Oe, is set to an initial state; next the applied magnetic field is gradually increased in the left direction up to such a strength that the magnetization of the free ferromagnetic layer seems to have been sufficiently reversed to the left; and then the applied magnetic field is gradually increased in the right direction up to such a strength that the magnetization of the free ferromagnetic layer seems to have been sufficiently reversed to the right. Thus, uniformity (operational uniformity) of response to repeated reversal of this free ferromagnetic layer, or the like were evaluated. This result is shown in the following Table 1. Here, in the rate of change of resistance, about 20% is set to a standard. That is, in the column of "Rate of change of resistance" of the following Table 1, sign "⊚" designates the range of 20% or more; sign "○" designates the range of more than 10% and less than 20%; sign "Δ" designates the range of 10% and less. Memory characteristic is relatively evaluated in terms of abruptness in the change in resistance showing reversal of the free ferromagnetic layer. That is, in the column of "Memory characteristic" of Table 1, to an amount of change of 100 Oe regarding the magnetic field, sign "⊚" designates a change in resistance of 2% or more; sign "○" designates a change in resistance of more than 1% and less than 2%; sign "Δ" designates a change in resistance of 1% and less. The operational magnetic field is evaluated based on whether or not the magnetic field, in which the change in resistance sufficiently occurs, is lower than 1 kOe. That is, in the column of "Operational magnetic field" of Table 1, the description "Low magnetic field" means that the operation is caused at 1 kOe and less; and the description "High magnetic field" means that the operation is caused at more than 1 kOe. The operational uniformity was relatively evaluated by depending upon whether or not the rate of change in resistance when the free ferromagnetic layer is reversed several times is sufficiently constant. That is, the column of "Operational uniformity" in Table 1 shows each uniformity in case of that the free ferromagnetic layer was reversed five times. Sign "⊚" denotes that the rate of change of resistance did not decrease; sign "○" denotes the decrease of less than a half; and sign "Δ" denotes the decrease a half or more.

TABLE 1

|  | Rate of change of resistance | Memory characteristic | Operational magnetic field | Operational uniformity |
|---|---|---|---|---|
| Example 1 | ○ | ○ | Low magnetic field | ○ |
| Example 2 | ⊚ | ⊚ | Low magnetic field | ⊚ |
| Example 3 | ⊚ | ⊚ | Low magnetic field | ⊚ |
| Example 4 | ○ | ⊚ | Low magnetic field | ⊚ |
| Example 5 | ○ | ○ | Low magnetic field | ○ |
| Example 6 | ○ | ○ | Low magnetic field | ○ |
| Comparative Example 1 | ⊚ | Δ | High magnetic field | Δ |

The result of Table 1 revealed that in Examples 1 to 6, a sufficient rate of change of resistance, memory characteristic and operational uniformity can be obtained in a low magnetic field. Particularly, the laminated configuration according to Example 2 having three ferromagnetic layers within the hard layer, of "thick ferromagnetic layer/thin non-magnetic layer/thin ferromagnetic layer/thin non-magnetic layer/thick ferromagnetic layer" shown in FIG. 2A, and the laminated configuration according to Example 3 having three ferromagnetic layers within the hard layer, of "thin ferromagnetic layer/thin non-magnetic layer/thick ferromagnetic layer/thin non-magnetic layer/thin ferromagnetic layer" shown in FIG. 1B showed good results from the viewpoint of all characteristics. Also, even when a number of the ferromagnetic layers within the hard layer according to the Example 4 is five, good results were obtained except for the rate of change of resistance. In other words, it provided desirable results that the number of the ferromagnetic layers within the hard layer is an odd number of three or higher.

On the other hand, it turned out that the first comparative example has problems in the memory characteristic and operation in a low magnetic field although it has a high rate of change of resistance.

Example 7

The present example is an example using the honeycomb array and rectangular array. The device was fabricated in the same manner as in Examples 1 to 6. However, starting point formation was performed by means of the FIB method after Al film formation of FIG. 5A. For the Ga⁺ ion at this time, through the use of a focused ion beam having an ion beam diameter of 30 nm, ion current of 10 pA and acceleration voltage of 30 kV, the focused ion beam is irradiated on the surface of the Al film like dots, whereby the starting point was formed at a depth of about 50 nm.

In the case of the honeycomb array, the starting point interval was set to 100 nm, and in the case of the rectangular array, a short interval was set to 80 nm while a long interval was set to 120 nm. Also, the anodization was performed in a 0.3 M oxalic acid aqueous solution at 40 V. Thus, when the pore wide treatment was performed in a 5% by mass phosphoric acid aqueous solution for 30 minutes, a round pore was obtained in the honeycomb array, and a rectangular pore with slightly round corners was obtained in the rectangular array. Thus, electrodeposition was performed at the same electrodeposition potential as in Examples 2 and 3. For the electrodeposition solution, however, there has been used an electrodeposition solution consisting of nickel sulfate 0.5 M, iron sulfate 0.5 M, and copper sulfate 0.001 M. As in Examples 2 and 3, after the laminated magnetic material is electrodeposited to the upper part of the pore to polish the surface, a surface insulated layer was formed, and the upper wiring was carried out for evaluation. Within the pore, there has been formed a laminated magnetic material consisting of a ferromagnetic layer of FeNi alloy including somewhat Cu and a non-magnetic layer of Cu.

A similar evaluation has been performed for this magnetic device. As a result, in the honeycomb array, the same characteristic as Examples 2 and 3 can be obtained, and further, the uniformity of characteristic by place was improved. This is attributable to uniformity in pore diameter and shape such as linearity. Also, in the rectangular array, in addition to the uniformity in place, the decreased operating magnetic field and somewhat improved rate of change of resistance have been seen. This is attributable to an effect of decreased diamagnetic field on the orientation of magnetization in each ferromagnetic material layer, and an effect of stabilized magnetization which have been exhibited by means of an anisotropic shape of the rectangle in addition to the uniformity of shape. Also, according to the present example, it has turned out that sufficient characteristic can be obtained even when a FeNi alloy is used in the ferromagnetic layer.

Example 8

The present example is an example in which any pore other than anodized alumina has been formed. First, on a Si substrate 51, Ti and Cu films 5 nm and 50 nm in thickness were formed by the sputtering method as the ground layer, and a $SiO_2$ film 52 of 500 nm thickness was formed on top thereof by the sputtering method to bring about the state shown in FIG. 5A. Cr film 100 nm in thickness, which serves as a mask, was formed on top thereof by the sputtering method, and thereafter, rectangular pores of 200 nm×100 nm each were formed at intervals of 500 nm by the FIB method as in the seventh embodiment, and rectangular pores were formed on the Cr film to the surface of the $SiO_2$ film 52. Thus, rectangular pores each having a similar shape to a pore of the mask were formed on the $SiO_2$ film to the ground layer by means of the dry etching method in a $CF_4$ atmosphere. Thus, a laminated magnetic material was fabricated as in Examples 1 to 6 for evaluation, and as a result, a sufficient change in resistance in a magnetic field, memory characteristic, a low magnetic field operation, and operation uniformity were obtained although the resistance itself is low.

When the laminated magnetic material as an element was fabricated by using the sputtering method of lamination instead of the electrodeposition process on performing the present embodiment, sufficient characteristic was obtained, but the characteristic such as the rate of change of resistance was several tens ratio lower than in the electrodeposition process probably because of non-uniform laminated state in the vicinity of the bottom portion of the pore.

What is claimed is:

1. A magnetic device which has a layer having pores on a substrate and is to be used by applying electric current in the direction of depth of said pores, comprising:

a laminated structure in which ferromagnetic layers and non-magnetic layers are laminated within a part or all of said pores;

wherein in said laminated structure a hard layer and a free ferromagnetic layer are laminated with a non-magnetic layer between said hard layer and said free ferromagnetic layer; and wherein said hard layer has a laminated structure in which a plurality of ferromagnetic layers form antiferromagnetic coupling through at least one part of said non-magnetic layers.

2. The magnetic device according to claim 1, wherein said plurality of ferromagnetic layers in said hard layer comprises an odd number of layers greater than or equal to three.

3. The magnetic device according to claim 2, wherein said plurality of ferromagnetic layers in said hard layer comprises ferromagnetic layers having different coercive forces.

4. The magnetic device according to claim 3, wherein said plurality of ferromagnetic layers in said hard layer is three ferromagnetic layers, and wherein a second layer of said plurality of ferromagnetic layers is thicker than a first layer and a third layer.

5. The magnetic device according to claim 3, wherein said plurality of ferromagnetic layers in said hard layer is three ferromagnetic layers, and wherein a second layer of said plurality of ferromagnetic layers is thinner than a first layer and a third layer.

6. The magnetic device according to claim 1, wherein a unit comprising said hard layer and said free ferromagnetic layer laminated with a non-magnetic layer between said hard layer and said free ferromagnetic layer is laminated by five or more periods.

7. The magnetic device according to claim 1, wherein at least one of said ferromagnetic layers contains Co, and said non-magnetic layer contains Cu.

8. The magnetic device according to claim 1, wherein at least one of said ferromagnetic layers contains a FeNi alloy and said non-magnetic layer contains Cu.

9. The magnetic device according to claim 1, wherein said layer having pores is an alumina nanohole layer formed by anodization.

10. The magnetic device according to claim 9, further comprising a conductive layer containing Cu on a substrate side of said pores.

11. The magnetic device according to claim 9, wherein said pores are arranged in a honeycomb shape.

12. The magnetic device according to claim 9, wherein said pores are arranged in rectangular array.

13. The magnetic device according to claim 9, wherein said pores are oval.

14. The magnetic device according to claim 9, wherein said pores are rectangular.

15. The magnetic device according to claim 1, wherein said ferromagnetic layers and said non-magnetic layer are formed by means of electrodeposition.

16. A solid-state magnetic memory having a magnetic device according to claim 1.

17. A CPP type magnetic device comprising:

a region having a pore;

a hard layer within the pore;

a free ferromagnetic layer within the pore; and a non-magnetic layer between said hard layer and said free ferromagnetic layer, wherein said hard layer has a laminated structure comprising a first ferromagnetic portion, a second ferromagnetic portion, and a non-magnetic portion between said first and second ferromagnetic portions, and wherein said second ferromagnetic portion antiferromagnetically couples with said first ferromagnetic portion.

18. A magnetic device comprising:

a region having a pore;

a hard layer within the pore;

a free ferromagnetic layer within the pore; and a non-magnetic layer between said hard layer and said free ferromagnetic layer, wherein said hard layer has a laminated structure comprising a first ferromagnetic portion, a second ferromagnetic portion, and a non-magnetic portion between said first and second ferromagnetic portions, and wherein said second ferromagnetic portion antiferromagnetically couples with said first ferromagnetic portion.

19. A magnetic device comprising:

a hard layer having a first ferromagnetic portion;

a free ferromagnetic layer having a second ferromagnetic portion; and a non-magnetic layer between said hard layer and said free ferromagnetic layer, wherein said hard layer, said free ferromagnetic layer, and said non-magnetic layer are formed inside pores of a region having pores.

20. The magnetic device according to claim 19, wherein said region having pores is comprised of alumina.

21. The magnetic device according to claim 19, wherein a diameter of each pore is in a range from a few nm to a few hundred nm.

22. The magnetic device according to claim 19, wherein said first ferromagnetic porition is comprised of the same material as that of said second ferromgnetic portion.

* * * * *

UNITED STATES PATENT AND TRADEMARK OFFICE
CERTIFICATE OF CORRECTION

PATENT NO. : 6,611,034 B2
DATED : August 26, 2003
INVENTOR(S) : Tohru Den

It is certified that error appears in the above-identified patent and that said Letters Patent is hereby corrected as shown below:

Column 3,
Line 46, "1996." should read -- 1996). --.

Column 11,
Line 25, "in the magnetic" should read -- to the magnetic --.

Column 14,
Line 47, "in rectangular" should read -- in a rectangular --.

Column 16,
Line 14, "porition" should read -- portion --; and
Line 15, "ferromgnetic" should read -- ferromagnetic --.

Signed and Sealed this

Thirteenth Day of July, 2004

JON W. DUDAS
*Acting Director of the United States Patent and Trademark Office*